(12) United States Patent
Takashima et al.

(10) Patent No.: US 7,518,178 B2
(45) Date of Patent: Apr. 14, 2009

(54) SEMICONDUCTOR MEMORY DEVICE (75) Inventors: Akira Takashima, Fuchu (JP); Hiroshi Watanabe, Yokohama (JP); Tatsuo Shimizu, Tokyo (JP); Takeshi Yamaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 145 days.

(21) Appl. No.: 11/531,933

(22) Filed: Sep. 14, 2006

(65) Prior Publication Data

US 2007/0132003 A1    Jun. 14, 2007

(30) Foreign Application Priority Data

Dec. 12, 2005    (JP)    ............................. 2005-357905

(51) Int. Cl.
    *H01L 29/788*    (2006.01)
(52) U.S. Cl. .................. 257/315; 257/316; 257/E29.3; 438/257
(58) Field of Classification Search ................. 257/314, 257/315, E29.3; 438/257
    See application file for complete search history.

(56) References Cited

U.S. PATENT DOCUMENTS

| 6,630,383 | B1 * | 10/2003 | Ibok et al. ................... 438/264 |
| 6,853,027 | B2 * | 2/2005 | Takasu ......................... 257/315 |
| 7,259,419 | B2 * | 8/2007 | Koo et al. ..................... 257/314 |
| 7,268,031 | B2 * | 9/2007 | Forbes .......................... 438/201 |
| 2004/0238873 | A1 * | 12/2004 | Koo et al. ..................... 257/314 |
| 2006/0022252 | A1 * | 2/2006 | Doh et al. ..................... 257/314 |
| 2007/0132003 | A1 | 6/2007 | Takashima et al. |
| 2008/0026532 | A1 * | 1/2008 | Duan et al. .................. 438/287 |
| 2008/0062757 | A1 * | 3/2008 | Forbes .......................... 365/182 |

OTHER PUBLICATIONS

U.S. Appl. No. 11/839,156, filed Aug. 15, 2007, Watanabe.
U.S. Appl. No. 12/189,400, filed Aug. 11, 2008, Shimizu et al.

* cited by examiner

*Primary Examiner*—Tuan N. Quach
(74) *Attorney, Agent, or Firm*—Oblon, Spivak, McClelland, Maier & Neustadt, P.C.

(57) ABSTRACT

A semiconductor memory device includes a semiconductor substrate, a first insulating film which is formed on the semiconductor substrate, a floating gate electrode which is formed on the first insulating film and made of a conductive metal oxide, a second insulating film which is formed on the floating gate electrode, has a relative dielectric constant of not less than 7.8, and is made of an insulating metal oxide of a paraelectric material, and a control gate electrode which is formed on the second insulating film and made of one of a metal and a conductive metal oxide.

14 Claims, 2 Drawing Sheets

SEMICONDUCTOR MEMORY DEVICE

CROSS-REFERENCE TO RELATED APPLICATIONS

This application is based upon and claims the benefit of priority from prior Japanese Patent Application No. 2005-357905, filed Dec. 12, 2005, the entire contents of which are incorporated herein by reference.

BACKGROUND OF THE INVENTION

1. Field of the Invention

The present invention relates to a semiconductor memory device with a double-gate structure having a floating gate electrode and control gate electrode.

2. Description of the Related Art

A cell transistor of a flash memory serving as a nonvolatile semiconductor memory has a double-gate structure including a floating gate electrode and control gate electrode. In this flash memory, the breakdown voltage of the transistor of the peripheral circuit becomes low as the microfabrication of memory cells progresses. Since a drop in maximum operating voltage is unavoidable, reduction of write and erase voltages is an important challenge. To efficiently inject electrons from the Si substrate to the floating gate electrode even at a low voltage, (a) the tunnel insulating film is made thin or (b) the capacitance of the interelectrode insulating film is increased to apply a high electric field to the tunnel insulating film.

In the method (a), however, when charge holding is taken into consideration, the thinning of the tunnel insulating film is limited. Detailed examples of the method (b) are (1) increasing the contact area between the floating gate electrode and the interelectrode insulating film (e.g., JP-A 2002-50703 (KOKAI) (patent reference 1)), (2) making the interelectrode insulating film thin (e.g., JP-A 8-17945 (KOKAI) (patent reference 2)), and (3) using a high-K insulating film as the interelectrode insulating film (e.g., JP-A 2003-168749 (KOKAI) (patent reference 3)).

In the method (1), since the control gate electrode is provided around the floating gate electrode, the cell interval can hardly be reduced. That is, the above-described problem is hard to solve because the scaling rule ($4F^2$) of the unit cell area cannot be satisfied in principle. In the method (2), it is difficult to suppress the leakage current between the floating gate electrode and the control gate electrode, and various operation errors occur. In the method (3), when a high-K insulating film (high dielectric constant insulating film) made of an oxide is formed on the floating gate electrode made of polysilicon as ever, a low-K interface layer (low dielectric constant interface layer) mainly containing $SiO_2$ is readily formed due to oxidation of the polysilicon. The low-K interface layer is hard to remove in the process. When the low-K interface layer is formed, the capacitances of the low-K interface layer and high-K insulating film are connected in series, and the effective capacitance of the interelectrode insulating film decreases. Even when a method of forming, as a floating gate electrode, a conductive oxide such as $RuO_2$ or $IrO_2$ on polysilicon is employed, as in patent reference 2, another low-K interface layer is readily formed because of reaction between the oxide and polysilicon. Even when the floating gate electrode is changed from polysilicon to a metal or conductive metal nitride to prevent formation of the low-K interface layer, the metal may form a reaction layer on the interface of the tunnel insulating film or interelectrode insulating film. Alternatively, the metal may be diffused to the tunnel insulating film to cause dielectric breakdown. As described above, difficulties in the process remain in the method (3).

A metal ferroelectric metal insulator semiconductor FET (MFMISFET) structure is known, in which a ferroelectric material is used for the interelectrode insulating film. However, a ferroelectric holds excessive charges because polarization occurs. In addition, since the dielectric film itself is fatigued by repetitive polarization in injecting charges into and removing them from the floating gate electrode, the polarization amount decreases, i.e., a so-called fatigue characteristic exists. For these reasons, threshold control is difficult, resulting in a problem of reliability.

There is also a silicon insulator metal insulator silicon (SIMIS) transistor disclosed in patent reference 4 (JP-A 2003-46004 (KOKAI)). In the SIMIS transistor, the floating gate electrode is made of a conductive oxide (M). The control gate electrode is made of silicon (S). The interelectrode insulating film is made of a compound (I) of silicon (S) and oxygen separated from a conductive oxide (M). However, the SIMIS transistor has the following problems. First, when a semiconductor is used for the control gate electrode, a depletion layer is formed upon applying a voltage to it. As a result, the capacitances of the depletion layer and interelectrode insulating film are connected in series, and the effective capacitance of the interelectrode insulating film decreases. Second, since the semiconductor of the control gate electrode reacts with the insulating film, a low-K interface oxide layer of $SiO_2$ or silicate is formed on the interface between the control gate electrode and the interelectrode insulating film. Hence, the capacitances of the interface oxide layer and interelectrode insulating film are connected in series, and the effective capacitance decreases even in this case. Third, when the interelectrode insulating film contains the semiconductor material of the control gate electrode, e.g., silicon, the interelectrode insulating film changes to silicate. Hence, the dielectric constant decreases, and the capacitance of the interelectrode insulating film consequently decreases.

BRIEF SUMMARY OF THE INVENTION

According to an aspect of the present invention, there is provided a semiconductor memory device comprising a semiconductor substrate, a first insulating film which is formed on the semiconductor substrate, a floating gate electrode which is formed on the first insulating film and made of a conductive metal oxide, a second insulating film which is formed on the floating gate electrode, has a relative dielectric constant of not less than 7.8, and is made of an insulating metal oxide of a paraelectric material, and a control gate electrode which is formed on the second insulating film and made of one of a metal and a conductive metal oxide.

DETAILED DESCRIPTION OF THE INVENTION

The embodiments of the present invention will be described below with reference to the accompanying drawing. In the following description, the same reference denote the same parts throughout the drawing.

1. EMBODIMENTS

1.1 Structure

Figure 1A:
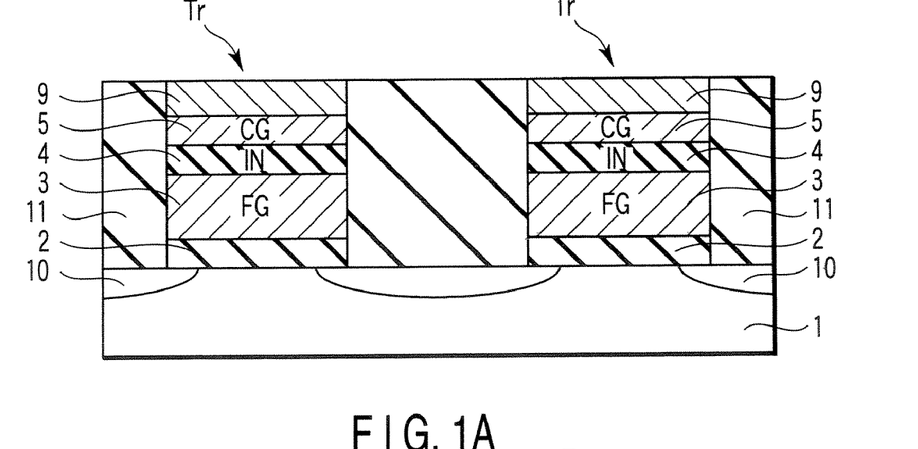
FIGS. 1A and 1B are schematic sectional views of a flash memory cell according to an embodiment.
Figure 1B:
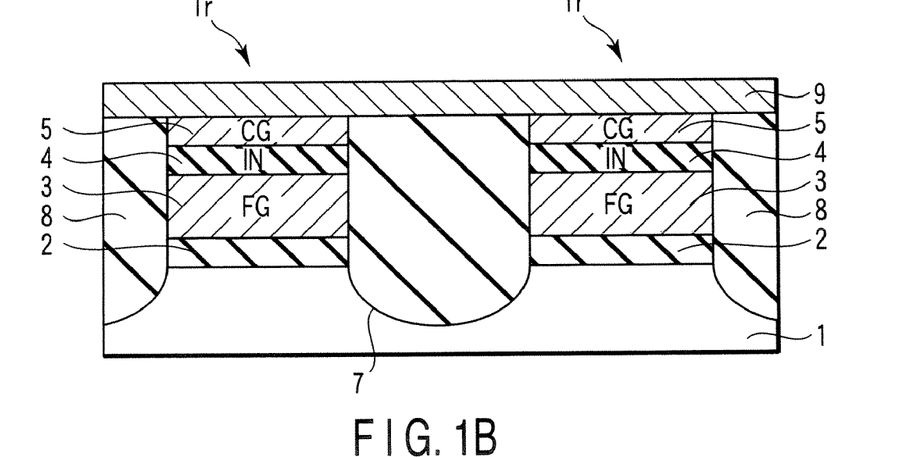

FIGS. 1A and 1B are schematic sectional views of a flash memory cell according to an embodiment of the present invention. FIG. 1A is a sectional view in a direction perpendicular to a word line (bit line direction). FIG. 1B is a sectional view in a direction parallel to the word line (word line direction). The schematic structure of the memory cell according to an embodiment of the present invention will be described below. The general structure of the flash memory except the memory cell is the same as that described in, e.g., Fujio Masuoka, "Advancing Flash Memory", Kogyo Chosakai Publishing, and a description thereof will be omitted.

As shown in FIGS. 1A and 1B, a tunnel insulating film 2, floating gate electrode FG, interelectrode insulating film IN, control gate electrode CG, and word line 9 are sequentially stacked on an Si substrate 1 so that a cell transistor Tr with a double-gate structure comprising the floating gate electrode FG and control gate electrode CG is formed. The floating gate electrode FG is formed from a conductive metal oxide film 3. The interelectrode insulating film IN is formed from an insulating metal oxide film 4 having a high dielectric constant (e.g., the relative dielectric constant is 7.8 or more) and made of a paraelectric material. The control gate electrode CG is formed from a conductive metal containing film 5.

As shown in FIG. 1A, source/drain diffusion layers 10 are formed in the Si substrate 1 by implanting an impurity. The source/drain diffusion layers 10 may be shared by adjacent cells, as shown in FIG. 1A. The gaps between adjacent cells are filled with an element isolation insulating film 11.

As shown in FIG. 1B, a trench 7 is formed in the Si substrate 1. An element isolation insulating film 8 is buried in the trench 7. The element isolation insulating film 8 covers the side surfaces of the tunnel insulating film 2, floating gate electrode FG, interelectrode insulating film IN, and control gate electrode CG. Adjacent cells are connected by the word line 9.

As described above, the interelectrode insulating film IN is made of an insulating metal oxide of a paraelectric material having a high dielectric constant. The floating gate electrode FG is made of a conductive metal oxide. For this reason, even when oxygen in the interelectrode insulating film IN reacts with the floating gate electrode FG upon formation of the interelectrode insulating film IN and floating gate electrode FG or upon a heating process necessary later, the floating gate electrode FG maintains the conductivity even after the progress of oxidation because it is made of the conductive metal oxide. A conventional floating gate electrode FG made of polysilicon, i.e., a polysilicon electrode causes oxidation reaction with oxygen in the interelectrode insulating film IN so that $SiO_2$ is formed. In this embodiment, since both the floating gate electrode FG and interelectrode insulating film IN are made of oxides, no interface oxide layer is formed even when oxidation or reduction is caused by interdiffusion between them. Conversely, even when oxygen diffused from the floating gate electrode FG to the interelectrode insulating film IN causes reaction, oxygen defects are compensated for. Hence, the amount of the leakage current flowing to the interelectrode insulating film IN decreases, and the reliability is improved. That is, since no oxide interface layer, i.e., no insulating film of, e.g., $SiO_2$ or silicate with a low dielectric constant is formed between the interelectrode insulating film IN and the floating gate electrode FG, a decrease in capacitance of the interelectrode insulating film IN can be suppressed. Hence, a semiconductor memory device capable of reducing the power consumption and increasing the operation speed can be provided because a high electric field can be applied to the tunnel insulating film 2, and electrons can efficiently be injected from the Si substrate 1 to the floating gate electrode FG even at a low voltage.

1.2 Manufacturing Method

Figure 2:
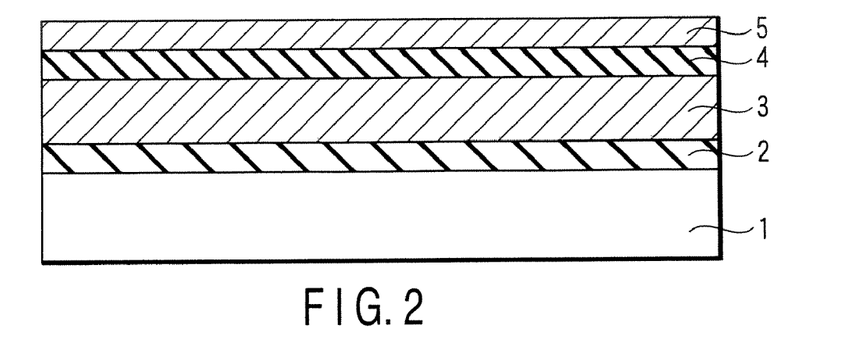
FIGS. 2, 3, and 4 are schematic sectional views showing steps in manufacturing the flash memory cell according to the embodiment.
Figure 3:
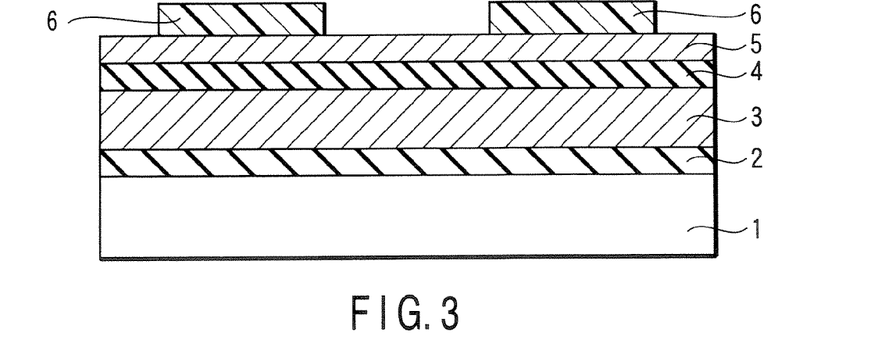
Figure 4:
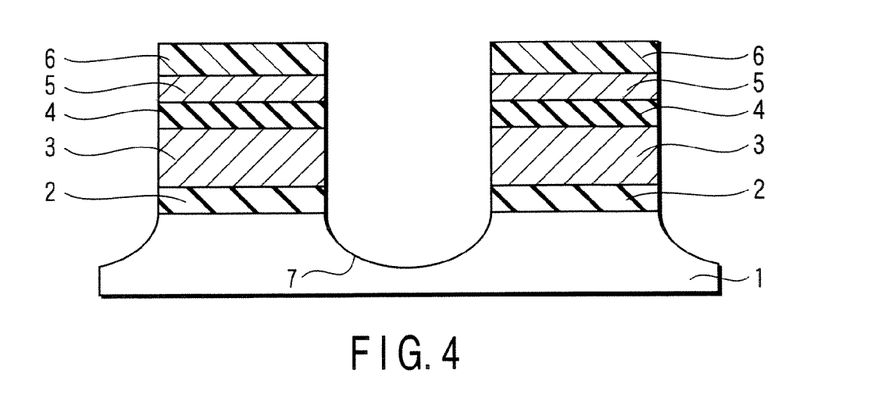

FIGS. 2 to 4 are schematic sectional views showing steps in manufacturing the flash memory cell according to an embodiment of the present invention. FIG. 2 to are sectional views in the word line direction, like FIG. 1B. The memory cell manufacturing method according to an embodiment of the present invention will be described below.

First, cell fabrication in the word line direction is executed. As shown in FIG. 2, dangling bonds on the surface of the Si substrate 1 are hydrogen-terminated by using hydrofluoric acid. The Si substrate 1 is heated in an oxygen atmosphere in an oxidation furnace so that the tunnel insulating film ($SiO_2$ film) 2 is formed on the Si substrate 1. The conductive metal oxide film 3, insulating metal oxide film 4, and conductive metal containing film 5 are sequentially formed on the tunnel insulating film 2 by using a film formation method such as sputtering. As shown in FIG. 3, a mask 6 made of, e.g., a photoresist is applied to the upper surface of the conductive metal containing film 5 and patterned by lithography. As shown in FIG. 4, the conductive metal containing film 5, insulating metal oxide film 4, conductive metal oxide film 3, tunnel insulating film 2, and part of the Si substrate 1 outside the region of the mask 6 are etched by anisotropic etching such as reactive ion etching (RIE). As a result, the trench 7 is formed in the Si substrate 1. The element isolation insulating film 8 is formed by chemical vapor deposition (CVD) to fill the trench 7 (FIG. 1B). The element isolation insulating film 8 and mask 6 are polished by chemical mechanical polishing (CMP), thereby ending element isolation. The word line 9 is formed on the conductive metal containing film 5 by CVD (FIG. 1B).

Next, cell fabrication in the bit line direction is executed. A mask (not shown) made of, e.g., a photoresist is applied to the upper surface of the word line 9 and patterned by lithography. The word line 9, conductive metal containing film 5, insulating metal oxide film 4, conductive metal oxide film 3, and tunnel insulating film 2 outside the region of the mask (not shown) are etched by anisotropic etching such as RIE to expose the surface of the Si substrate 1. Impurity ions are implanted in the surface of the Si substrate 1 to form the source/drain diffusion layers 10 (FIG. 1A). The mask (not shown), word line 9, conductive metal containing film 5, insulating metal oxide film 4, conductive metal oxide film 3, and tunnel insulating film 2 are buried with the element isolation insulating film 11. The element isolation insulating film 11 and mask (not shown) are removed by CMP.

Consequently, the cell transistor Tr with a double-gate structure comprising the floating gate electrode FG and control gate electrode CG is completed, as shown in FIGS. 1A and 1B.

The above-described manufacturing method is merely an example. Any other film formation method and film formation procedures can be employed if the structure shown in FIGS. 1A and 1B is formed. For example, not only sputtering or CVD but also metal organic chemical vapor deposition (MOCVD), pulse laser deposition (PLD), or atomic layer deposition (ALD) may be used to form the layers of the memory cell. The film formation procedures may be changed by using a gate last method to form the source/drain diffusion layers 10 before formation of the layers of the memory cell.

1.3 Materials (1) Materials

The interelectrode insulating film IN is made of an insulating metal oxide having a high dielectric constant. The material of the interelectrode insulating film IN contains at least one element selected from the group consisting of an alkaline-earth metal, rare-earth metal, Ti, Zr, Hf, Ta, and Al. Detailed examples are compounds containing one element of La, Al, Zr, and Hf. e.g., LaAlO, LaZrO, LaHfO, HfAlO, ZrAlO, ZrO, HfO, and AlO. Of the above-described materials, not a ferroelectric material but a paraelectric material is preferable. If a ferroelectric material is used for the interelectrode insulating film IN, the reliability of the element may degrade, as described above. Not a low-K material but a high-K material is used for the interelectrode insulating film IN to prevent a decrease in capacitance of it.

The relative dielectric constant of the material of the interelectrode insulating film IN is preferably 7.8 to 78. The lower and upper limit values are defined on the basis of $SiO_2$ (relative dielectric constant: 3.9) of the tunnel insulating film 2. The tunnel insulating film 2 may be made of SiON, as will be described later. The reason why not SiON but $SiO_2$ is used as a reference is as follows. The relative dielectric constant of SiON changes (changes to about 5 to 7) depending on the composition ratio of oxygen and nitrogen. However, the relative dielectric constant of $SiO_2$ remains unchanged at 3.9 and is lower than that of SiON.

The lower limit value is defined because the capacitance ratio to $SiO_2$ (relative dielectric constant: 3.9) serving as the tunnel insulating film 2 is preferably twice or more. For example, when the relative dielectric constant of the interelectrode insulating film IN is twice the tunnel insulating film 2, the necessary voltage to be applied to the interelectrode insulating film IN can be halved, and the voltage to be applied to the control gate electrode CG can be suppressed, as compared to a structure in which both the interelectrode insulating film IN and tunnel insulating film 2 are made of $SiO_2$ and have the same thickness. Hence, the lower limit value of the relative dielectric constant of the interelectrode insulating film IN is defined as "7.8", i.e., twice the relative dielectric constant (3.9) of $SiO_2$.

On the other hand, the upper limit value is defined because the voltage necessary for the write and erase is limited even when a material with a high relative dielectric constant is used for the interelectrode insulating film IN. For example, assume that both the interelectrode insulating film IN and tunnel insulating film 2 are made of the same material and have the same thickness, and the control gate voltage necessary for the write and erase is 20 V. In this case, a voltage of 10 V is applied to each of the interelectrode insulating film IN and tunnel insulating film 2. That is, the voltage of the tunnel insulating film 2 necessary for the write and erase is 10 V. When the relative dielectric constant of the interelectrode insulating film IN is increased to 20 times, the voltage necessary for the interelectrode insulating film IN can be decreased to 0.5 V. That is, the erase and write can be done at a control gate voltage of 10.5 V. Assume that a material with a higher relative dielectric constant, e.g., a material with a relative dielectric constant higher by 50 times or more is used for the interelectrode insulating film IN. In this case, the voltage to be applied to the interelectrode insulating film IN is 0.25 V. However, the necessary voltage to be applied to the control gate electrode CG is about 10.25 V so there is almost no merit. In addition, a dielectric material tends to decrease the band gap along with an increase in relative dielectric constant so it is difficult to suppress the leakage current. For example, in $TiO_2$ with a relative dielectric constant of 80, the band gap is 3.5 eV. In $SrTiO_3$ with a relative dielectric constant of 200, the band gap is 3.1 eV. Such a material is hard to use for an insulating film. Hence, the upper limit value of the relative dielectric constant of the interelectrode insulating film IN is defined as "78", i.e., 20 times the relative dielectric constant (3.9) of $SiO_2$.

The relative dielectric constants of materials available for the interelectrode insulating film IN will be examined. For example, the relative dielectric constant is 30 in $La_2O_3$, 25 in $ZrO_2$ and $HfO_2$, and 8.5 in $Al_2O_3$. If a compound of them (e.g., $LaAlO_3$) is used, the relative dielectric constant of the material of the interelectrode insulating film IN is about 8.5 to 30. In addition, since the relative dielectric constant of $SrZrO_3$ available for the interelectrode insulating film IN is 60, the relative dielectric constant of the material of the interelectrode insulating film IN is about 8.5 to 60.

The floating gate electrode FG is made of a conductive metal oxide. The material of the floating gate electrode FG contains at least one element selected from the group consisting of Ti, Zr, Hf, V, Nb, Ta, Cr, Mo, W, Mn, Tc, Re, Fe, Ru, Os, Co, Rh, Ir, Ni, Pd, Pt, Au, and Al.

The control gate electrode CG is made of a metal or conductive metal oxide. The material of the control gate electrode CG contains at least one element selected from the group consisting of Ti, Zr, Hf, V, Nb, Ta, Cr, Mo, W, Mn, Tc, Re, Fe, Ru, Os, Co, Rh, Ir, Ni, Pd, Pt, Au, and Al. The control gate electrode CG may be made of the same material as the floating gate electrode FG. When these electrodes are made of the same material, the process becomes easy.

The tunnel insulating film 2 is formed from, e.g., an $SiO_2$ or SiON insulating film. On the basis of the operation principle of the flash memory, the capacitance of the tunnel insulating film 2 is preferably lower than that of the interelectrode insulating film IN to apply a high voltage to the tunnel insulating film 2. Hence, the relative dielectric constant of the tunnel insulating film 2 is preferably lower than that of the interelectrode insulating film IN.

(2) Standard Entropy of Formation

A standard entropy $SE_{FG}$ of formation per unit oxygen of the material of the floating gate electrode FG is preferably larger than a standard entropy $SE_{IN}$ of formation per unit oxygen of the material of the interelectrode insulating film IN. Additionally, a standard entropy $SE_{CG}$ of formation per unit oxygen of the material of the control gate electrode CG is preferably larger than the standard entropy $SE_{IN}$ of formation per unit oxygen of the material of the interelectrode insulating film IN. The interelectrode insulating film IN made of such a material is more stable as an oxide than the floating gate electrode FG or control gate electrode CG. Hence, oxygen defects are hardly formed, and the reliability of insulating properties can be improved. For example, when a thermal process is executed to improve the film properties of the interelectrode insulating film IN, oxygen of the floating gate electrode FG containing a material with a large standard entropy of formation per unit oxygen is dissociated and diffused to the interelectrode insulating film IN. If the interelectrode insulating film IN contains a material with a small standard entropy of formation per unit oxygen, oxygen defects hardly increase because the oxygen is hardly dissociated. In addition, since the oxygen defects are compensated for by oxygen of the floating gate electrode FG, the insulating properties are improved, and the reliability increases. The floating gate electrode FG maintains the conductivity even when oxygen defects are produced. Even in interconnection formation or interlayer dielectric film formation as a process of applying heat after the floating gate electrode FG and interelectrode insulating film IN are formed, the same effects as described above can be expected.

Table 1 shows examples of the standard entropy of formation of insulating film materials and electrode materials made of metal oxides according to an embodiment of the present invention. As can be seen from Table 1, a material having a large standard entropy of formation per unit oxygen readily dissociates oxygen and produces oxygen defects. A material having a small standard entropy of formation per unit oxygen hardly produces oxygen defects.

TABLE 1

Standard Entropy of formation of Metal Oxide (Unit: KJmol-1)

| Insulating Material | ΔH | ΔH Per Unit Oxygen |
|---|---|---|
| CaO | −634.9 | −634.9 |
| SrO | −592 | −592.0 |
| BaO | −548 | −548.0 |
| $TiO_2$ | −944 | −472.0 |
| $ZrO_2$ | −1100.6 | −550.3 |
| $HfO_2$ | −1144.7 | −572.4 |
| $Al_2O_3$ | −1675.7 | −1117.1 |
| $Sc_2O_3$ | −1908.8 | −1272.5 |
| $Y_2O_3$ | −1905.3 | −1270.2 |
| $La_2O_3$ | −1793.7 | −1195.8 |
| $Pr_2O_3$ | −1809.6 | −1206.4 |
| $Nd_2O_3$ | −1807.9 | −1205.3 |
| $Sm_2O_3$ | −1823 | −1215.3 |
| $Eu_2O_3$ | −1651.4 | −1100.9 |
| $Gd_2O_3$ | −1819.6 | −1213.1 |
| $Tb_2O_3$ | −1865.2 | −1243.5 |
| $Dy_2O_3$ | −1863.1 | −1242.1 |
| $Ho_2O_3$ | −1880.7 | −1253.8 |
| $Er_2O_3$ | −1897.9 | −1265.3 |
| $Tm_2O_3$ | −1888.7 | −1259.1 |
| $Yb_2O_3$ | −1814.6 | −1209.7 |
| $Lu_2O_3$ | −1878.2 | −1252.1 |

| Electrode Material | ΔH | ΔH Per Unit Oxygen |
|---|---|---|
| $TiO_2$ | −944 | −472.0 |
| $ZrO_2$ | −1100.6 | −550.3 |
| $HfO_2$ | −1144.7 | −572.4 |
| $V_2O_5$ | −1550.6 | −620.2 |
| $Nb_2O_5$ | −1899.5 | −759.8 |
| $Ta_2O_5$ | −2046 | −818.4 |
| $CrO_2$ | −598 | −299.0 |
| $MoO_2$ | −588.9 | −294.5 |
| $WO_2$ | −589.7 | −294.9 |
| $MnO_2$ | −520 | −260.0 |
| $Re_2O_7$ | −1240.1 | −345.3 |
| $Fe_2O_3$ | −824.2 | −549.5 |
| $RuO_2$ | −305 | −152.5 |
| $OsO_4$ | −394.1 | −98.5 |
| CoO | −237.9 | −119.0 |
| $Rh_2O_3$ | −343 | −228.7 |
| $IrO_2$ | −274.1 | −137.1 |
| $Ni_2O_3$ | −489.5 | −329.3 |

As is apparent from Table 1, some metal oxides (e.g., $TiO_2$, $ZrO_2$, and $HfO_2$) are used as both the insulating film material and electrode material. Such materials are used as an electrode or insulating film depending on the oxygen defect amount from a stoichiometry that should exhibit insulating properties. Whether the material functions as an electrode or insulating film depending on oxygen defects can be determined by inspecting the oxygen defect amount or the like by using physical analysis such as positron annihilation or measuring the amount of the current flowing to the insulating film.

Detailed examples based on the standard entropy of formation per unit oxygen are as follows.

Detailed Example 1

The material of an interelectrode insulating film IN is preferably a binary oxide for which one element is selected from Al and rare-earth metals (Sc, Y, and lanthanoids) except Ce, a ternary oxide for which two elements are selected from Al and the above-described rare-earth metals, or a quaternary oxide containing three or more elements. The reason is that the standard entropy of formation per unit oxygen is sufficiently small in these materials.

The electrode material of a floating gate electrode FG and control gate electrode CG preferably mainly contains at least one element selected from the group consisting of Cr, Mo, W, Mn, Re, Ru, Os, Co, Rh, Ir, and Ni. The reason is that the standard entropy of formation per unit oxygen is sufficiently large in these materials.

All the materials described in Detailed Example 1 satisfy the relationship ($SE_{FG}>SE_{IN}$) of the standard entropy of formation per unit oxygen between the interelectrode insulating film IN and the floating gate electrode FG or the relationship ($SE_{CG}>SE_{IN}$) of the standard entropy of formation per unit oxygen between the interelectrode insulating film IN and the control gate electrode CG.

Detailed Example 2

In Detailed Example 2, an interelectrode insulating film IN contains an element selected from the group consisting of Ca, Sr, Ba, Ti, Zr, Hf, and Ce, and a floating gate electrode FG and control gate electrode CG contain an element selected from the group consisting of Ti, Zr, Hf, V, Nb, Ta, and Fe.

These materials can be arranged as follows in ascending order of standard entropy of formation per unit oxygen. Note that "insulating film" indicates the interelectrode insulating film IN, and "electrode" indicates the floating gate electrode FG and control gate electrode CG.

Insulating film: Ca<Sr<Hf<Zr<Ba<Ce<Ti
Electrode: Ta<Nb<V<Hf<Zr<Fe<Ti
Insulating film+electrode: Ta<Nb<Ca<V<Sr<Hf<Zr<Fe<Ba<Ce<Ti (a) There are 12 combinations of binary oxides of "insulating film/electrode".
"CaO/VO", "CaO/HfO", "CaO/ZrO", "CaO/TiO",
"SrO/HfO", "SrO/ZrO", "SrO/TiO",
"HfO/ZrO", "HfO/TiO",
"ZrO/TiO", "BaO/TiO", "CeO/TiO"

(b) Ternary oxides are also available, for which one element is selected from Al and rare-earth metals and added to both the insulating film and electrode of (a). For example, combinations of "insulating film/electrode" are as follows.
"CaAlO/VAlO", "CaAlO/HfAlO", "CaAlO/ZrAlO", "CaAlO/TiAlO",
"LaAlO/LaVO", "LaAlO/LaHfO", "LaAlO/LaZrO", "LaAlO/LaTiO",
"HfAlO/ZrAlO", "HfAlO/TiAlO",
"LaZrO/LaTiO", "LaBaO/LaTiO", "LaCeO/LaTiO"

(c) Combinations of "insulating film/electrode" of ternary oxides containing only the above elements are as follows.
"CaSrO/CaTiO", "CaHfO/CaTiO", "CaZrO/CaTiO", "CaBaO/CaTiO", "CaCeO/CaTiO",
"SrHfO/SrTiO", "SrZrO/SrTiO", "SrBaO/SrTiO", "SrCeO/SrTiO",
"HfZrO/HfTiO", "HfBaO/HfTiO", "HfCeO/HfTiO",
"ZrBaO/ZrTiO", "ZrCeO/ZrTiO"
"BaCeO/BaZrO"

(d) Examples of "insulating film/electrode" which combine a binary oxide and a ternary oxide are as follows.

"HfO/LnTiO", "HfO/AlTiO", "HfO/SrTiO", "ZrO/LnTiO", "ZrO/AlTiO", "ZrO/SrTiO"

(e) Examples of "insulating film/electrode" which combine a ternary oxide and a binary oxide are as follows.

"LaAlO/TiO", "LaAlO/ZrO", "LaHfO/TiO", "LaHfO/ZrO"

Examples of inappropriate combinations of "insulating film/electrode" from the viewpoint of the standard entropy of formation per unit oxygen are "HfTiO/HfTaO", "HfTiO/HfNbO", "HfBaO/HfTaO", and "HfBaO/HfNbO". This is because the standard entropy of formation per unit oxygen of Ti or Ba is smaller than that of Ta, Nb, or Hg.

Many of the above-described electrode materials normally exhibit insulating properties so that oxygen defects must be introduced, or a transition metal must be doped. To introduce oxygen defects, some measure such as low oxygen film formation is necessary. To dope a transition metal, the conductivity can be ensured by doping a metal used as the electrode material.

(3) Work Function and Electron Affinity

Emphasis is placed on a work function $\phi m_{FG}$ [eV] of the floating gate electrode FG, a work function $\phi m_{CG}$ [eV] of the control gate electrode CG, and an electron affinity $EA_{IN}$ [eV] of the interelectrode insulating film IN. The following two conditions can be considered. However, all the following conditions need not be satisfied. The work function here is a value obtained by a method such as ultraviolet photoemission spectroscopy or thermionic emission to apply an energy to an electrode. It indicates an ideal work function (the Schottky parameter is 1) described as in a data book, not a work function that changes in an interface state such as a Schottky height where an electrode and semiconductor contact.

The first condition is mainly defined on the basis of the charge holding characteristic of the memory cell.

When the memory cell transistor Tr is an n-channel MISFET, the work function $\phi m_{FG}$ of the material of the floating gate electrode FG is preferably larger than the electron affinity $EA_{IN}$ of the material of the interelectrode insulating film IN by 1.0 eV or more. The work function $\phi m_{CG}$ of the material of the control gate electrode CG is preferably larger than the electron affinity $EA_{IN}$ of the material of the interelectrode insulating film IN by 1.0 eV or more. If an electron barrier of 1.0 eV or more is present between the floating gate electrode FG and the interelectrode insulating film IN and between the control gate electrode CG and the interelectrode insulating film IN, the effect of confining charges injected in the floating gate electrode FG in it can be increased.

On the other hand, when the memory cell transistor Tr is a p-channel MISFET, holes are stored in the floating gate electrode FG. Hence, the work function $\phi m_{FG}$ of the material of the floating gate electrode FG and the work function $\phi m_{CG}$ of the material of the control gate electrode CG are preferably smaller than the sum of the electron affinity $EA_{IN}$ and band gap $EG_{IN}$ of the interelectrode insulating film IN by 1.0 eV or more.

The second condition is mainly defined on the basis of the power consumption. The principle of the second condition is described in detail in JP-A 2005-191354 (KOKAI).

When the memory cell transistor Tr is an n-channel MISFET, the work function $\phi m_{FG}$ of the material of the floating gate electrode FG preferably satisfies $\phi m_{FG} \leq 4.45$ eV. In JP-A 2005-191354 (KOKAI), a gate electrode of an n-channel MISFET preferably includes a conductive oxide film whose work function $\phi m$ satisfies $\phi m \leq 4.45$ eV. The upper limit value of the work function $\phi m$ is a condition to decrease the threshold voltage to at least 0.4 V or less. If the work function exceeds the upper limit value, a higher voltage is necessary in the erase, resulting in an increase in power consumption. When a material having the work function $\phi m_{FG}$ of 4.45 eV or less is used for the floating gate electrode FG, the erase voltage in discharging electrons to the substrate side can be made low so that the erase can be done at a low voltage.

When the memory cell transistor Tr is an n-channel MISFET, the floating gate electrode FG more preferably includes a conductive oxide film whose work function $\phi m_{FG}$ satisfies $3.65 \text{ eV} \leq \phi m_{FG}$. Since the work function $\phi m_{FG}$ almost equals the work function of the channel portion of the Si substrate, the same circuit design as in the conventional flash memory using polysilicon for the floating gate electrode FG is possible. In addition, if the work function of the floating gate electrode FG is too large, the electron barrier becomes small, and the direct tunnel probability of the tunnel insulating film increases, resulting in degradation in charge holding characteristic of the memory cell.

When the memory cell transistor Tr is a p-channel MISFET, the work function $\phi m_{FG}$ of the material of the floating gate electrode FG preferably satisfies $4.77 \text{ eV} \pm \phi m_{FG}$. This condition is set due to the same reason as in defining the upper limit value of the work function $\phi m_{FG}$ in the n-channel MISFET, i.e., in order to reduce the power consumption.

When the memory cell transistor Tr is a p-channel MISFET, the floating gate electrode FG more preferably includes a conductive oxide film whose work function $\phi m_{FG}$ satisfies $\phi m_{FG} \pm 5.57$ eV. This condition is set due to the same reason as in defining the lower limit value of the work function $\phi m_{FG}$ in the n-channel MISFET. That is, if the work function $\phi m_{FG}$ is small, the hole barrier between the floating gate electrode FG and the interelectrode insulating film IN becomes small, resulting in degradation in charge holding characteristic.

For the second condition, the definition of the work function $\phi m_{FG}$ of the floating gate electrode FG may be applied to the definition of the work function $\phi m_{CG}$ of the control gate electrode CG.

Detailed examples based on the above-described viewpoint are as follows. Examples in which both of the above-described first and second conditions are satisfied will be described. A material that satisfies one of them may also be used, as a matter of course.

Examples of the material of the interelectrode insulating film IN with a small electron affinity are $Al_2O_3$ (1.0 eV), $Y_2O_3$ (2.0 eV), $La_2O_3$ (2.0 eV), $ZrO_2$ (2.5 eV), $HfO_2$ (2.5 eV), $BaZrO_3$ (2.5 eV), and $LaAlO_3$ (2.5 eV). Rare-earth oxides except $CeO_2$ which have almost the same electron affinity as those materials may also be used. Compounds of a rare-earth metal and Zr or Hf, e.g., LaHfO and LaZrO are preferably used because they have almost the same electron affinity as $HfO_2$ or $ZrO_2$.

Examples of binary oxides whose work function satisfies $\phi m \leq 4.45$ eV as the material of the electrode are TiO, VO, and NbO. Examples of ternary $ABO_3$ oxide are oxides which combine A=Ca, Sr, Ba, and La and B=Ta, Nb, V, and Ti. Examples of ternary oxides are $SrTiO_3$, $CaTiO_3$, and $LaTiO_3$.

When the above-described electrode materials and insulating materials are combined, the difference between the work function and the electron affinity is always 1 eV or more.

(4) Standard Entropy Of Formation+Work Function+Electron Affinity Examples

Examples of material combinations considering the conditions of the above-described (2) standard entropy of formation and (3) both of the work function and electron affinity will be described here.

Combinations of the materials of the interelectrode insulating film IN, floating gate electrode FG, and control gate electrode CG will be examined on the basis of the materials of the interelectrode insulating film IN. The materials of the interelectrode insulating film IN are classified on the basis of groups in the periodic table of elements because an oxide with a large standard entropy of formation determines the stability of bonding to oxygen.

High-K metal oxides which form the interelectrode insulating film IN can be classified into (a) group 3 and Al, (b) group 4, and (c) group 2 in the periodic table of elements. Materials of group 1 and group 5 or more are omitted because they can hardly be applied to the interelectrode insulating film IN due to a large electron affinity or function as a conductor due to a small band gap.

(a) Group 3: rare-earth metals (except Ce) and Al
(b) Group 4: group 4 metals (except Ti)
(c) Group 2: alkaline-earth metals Characteristic features and detailed examples based on this classification will be described below.

(a) Group 3 materials and Al have a small electron affinity and standard entropy of formation per unit oxygen. For this reason, all oxide electrode materials can be used for such insulating film materials. Detailed examples are as follows.

Examples of such a material are LnO (Ln: Al and rare-earth metals except Ce), e.g., $La_2O_3$, $LaAlO_3$, $Pr_2O_3$, and $PrAlO_3$. The reason why Ce is excluded from the rare-earth metals is that Ce is stable as quadrivalent $CeO_2$ and has a large electron affinity per unit oxygen.

(b) Some group 4 materials have a small electron affinity but larger standard entropy of formation per unit oxygen than an electrode material. Hence, an electrode material containing an oxide with a large standard entropy of formation per unit oxygen is necessary for such insulating materials. Detailed examples are as follows.

Examples of the group 4 materials are XO (X=Zr, Hf), e.g., $ZrO_2$, $HfO_2$, and $Zr_xHf_{(1-x)}O_2$. The reason why Ti is excluded from the group 4 metals is that the electron affinity of Ti is too large.

Examples of combinations of the group 3 materials and group 4 materials are LnXO (Ln=Al and rare-earth metals except Ce; X=Zr, Hf), e.g., $La_2Hf_2O_7$ and $Hf_2Al_2O_7$.

(c) Group 2 materials have a larger electron affinity and standard entropy of formation per unit oxygen than the group 3 and group 4 materials. Hence, an electrode material containing an oxide with a large standard entropy of formation per unit oxygen and having a large electron affinity is necessary for such insulating materials. Detailed examples are as follows.

Examples of the group 2 materials are AO (A=Ca, Ba, Sr), e.g., CaO, SrO, and BaO.

Examples of combinations of the group 2 materials and group 3 materials are LnAO (Ln=Al and rare-earth metals except Ce; A=Ca, Ba, Sr), e.g., $CaLa_2O_4$ and $SrAl_2O_4$.

Examples of combinations of the group 2 materials and group 4 materials are AXO (A=Ca, Ba, Sr; X=Zr, Hf), e.g., $SrZrO_3$, $CaZrO_3$, and $BaZrO_3$.

On the basis of the above-described materials (a) to (c) of the interelectrode insulating film IN, the interelectrode insulating film IN is preferably made of an oxide of La and Al (e.g., $LaAlO_3$), an oxide of Hf (e.g., $HfO_2$), an oxide of Sr and Zr (e.g., $SrZrO_3$), an oxide of La and Zr (e.g., $LaZrO_3$), an oxide of La and Hf (e.g., $LaHfO_3$), or an oxide of Zr (e.g., $ZrO_2$). The floating gate electrode FG is preferably made of an oxide of Sr and Ti doped with La (e.g., La—$SrTiO_{3-x}$ ($0 \leq x \leq 1$)), an oxide of Sr and Ti doped with Nb (e.g., Nb—$SrTiO_{3-x}$ ($0 \leq x \leq 1$)), an oxide of Sr and Ti doped with V (e.g., V—$SrTiO_{3-x}$ ($0 \leq x \leq 1$)), an oxide of Sr and Ru (e.g., $SrRuO_3$), or an oxide of Ti (e.g., $TiO_{2-x}$ ($0 < x \leq 1$)).

More detailed examples of the combination of control gate electrode CG/interelectrode insulating film IN/floating gate electrode FG are as follows. As the interelectrode insulating film IN, materials stable in the atmosphere were selected here. In other words, materials that do not react with the components of the atmosphere, i.e., cause neither moisture absorption nor carbon dioxide absorption were used.

Case 1: Al/$LaAlO_3$/$SrTiO_{3-x}$ ($0<x \leq 1$)
Case 2: Pt/$HfO_2$/$SrTiO_{3-x}$ ($0<x \leq 1$)
Case 3: $SrRuO_3$/$SrZrO_3$/$SrRuO_3$ In Case 1, $LaAlO_3$ of the interelectrode insulating film IN was selected from the above-described group 3 materials (a). All binary oxides of $Ln_2O_3$ have hygroscopic properties except Al. For this reason, they may deteriorate if left to stand in the atmosphere. In addition, a wet process of the semiconductor process must be used with some measure. $LaAlO_3$ was selected because the above properties could be stabilized by using $LnAlO_3$. $SrTiO_{3-x}$ ($0<x \leq 1$) of the floating gate electrode FG was selected because its work function almost equaled the electron affinity of Si. When the electron affinity of the Si substrate and the work function of the floating gate electrode FG have no difference, the threshold voltages in storing/removing charges in/from the floating gate electrode FG can be equal. Al of the control gate electrode CG was selected because it was widely used as the interconnection material of current semiconductor devices. For further information about Example 1, see Example 1 to be described later.

In Case 2, $HfO_2$ of the interelectrode insulating film IN was selected from the high-K insulating film candidates of the above-described group 4 materials (b). $SrTiO_{3-x}$ ($0<x \leq 1$) of the floating gate electrode FG was selected due to the same reason as in Case 1. Pt of the control gate electrode CG was selected because it had a low reactivity to oxygen. For further information about Case 2, see Example 2 to be described later.

In Case 3, $SrZrO_3$ of the interelectrode insulating film IN was selected from the above-described combinations of group 2 and group 4 materials (c). Binary oxides of AO (A=Ca, Sr, Ba) absorb moisture and carbon dioxide and therefore deteriorate if left to stand in the atmosphere. The process requires some measure due to the same reason as in the above-described $Ln_2O_3$ (a). $SrZrO_3$ was selected because these properties could be stabilized by using $AXO_3$ (X=Zr, Hf). The material of the floating gate electrode FG and control gate electrode CG, i.e., $SrRuO_3$ (5.1 eV) was selected because it had a large work function to ensure a difference to the electron affinity (3.1 eV) of $SrZrO_3$ of the interelectrode insulating film IN. For further information about Case 3, see Example 3 to be described later.

(5) Crystal Structure

The floating gate electrode FG, interelectrode insulating film IN, and control gate electrode CC are heated in the activation process after ion implantation or for improvement of film properties after film formation. At this time, the crystal states of the films change to amorphous, polycrystalline, or orientated film (including an epitaxial film). Any crystal state is allowable.

A detailed example of the crystal structure of the floating gate electrode FG and control gate electrode CG will be described here. The floating gate electrode FG and control gate electrode CG can have either same or different crystal structures. Especially, when the two layers have a small lattice constant difference between crystals and are epitaxial films orientated from the semiconductor substrate, the leakage current caused by the grain boundary of the polycrystal decreases, and a variation in electric characteristic caused by the grain size can be suppressed. Hence, the reliability can be improved.

Detailed Example 1

In Detailed Example 1, the floating gate electrode FG and control gate electrode CG have a polycrystalline state.

Examples of binary crystal structures are a BO halite structure, $B_2O_3$ corundum structure, $BO_2$ rutile structure, and $ReO_3$ structure. B is selected from Ti, Zr, Hf, V, Nb, Ta, Cr, Mo, W, Mn, Tc, Re, Fe, Ru, Os, Co, Rh, Ir, Ni, Pd, Pt, Au, and Al.

Examples of ternary crystal structures are an $ABO_3$ perovskite structure, $A_2B_2O_7$ pyrochlore structure, and $A_2BO_4$ $K_2NiF_4$ structure. A is selected from alkaline-earth metals and rare-earth metals. B is selected from Ti, Zr, Hf, V, Nb, Ta, Cr, Me, W, Mn, Tc, Re, Fe, Ru, Os, Co, Rh, Ir, Ni, Pd, Pt, Au, and Al.

Detailed Example 2

In Detailed Example 2, oxygen defects are produced in Detailed Example 1.

Examples of binary crystal structures are a $BO_{1-x}$ halite structure, $B_2O_{3-x}$ corundum structure, $BO_{2-x}$ rutile structure, and $ReO_{3-x}$ structure. B is selected from Ti, Zr, Hf, V, Nb, Ta, Cr, Mo, W, Mn, To, Re, Fe, Ru, Os, Co, Rh, Ir, Ni, Pd, Pt, Au, and Al. The value $\underline{x}$ preferably satisfies $0 < x \leq 0.5$.

Examples of ternary crystal structures are an $ABO_{3-y}$ perovskite structure, $A_2B_2O_{7-y}$ pyrochlore structure, and $A_2BO_{4-y}$ $K_2NiF_4$ structure. A is selected from alkaline-earth metals and rare-earth metals. B is selected from Ti, Zr, Hf, V, Nb, Ta, Cr, Mo, W, Mn, Tc, Re, Fe, Ru, Os, Co, Rh, Ir, Ni, Pd, Pt, Au, and Al. The value $\underline{y}$ preferably satisfies $0 < y \leq 0.5$.

2. EXAMPLES AND COMPARATIVE EXAMPLE

Examples and comparative example of the above-described flash memory using specific materials will be described.

2.1 Example 1

A flash memory cell of Example 1 is made of the above-described materials of Example 1 ($Al/LaAlO_3/SrTiO_{3-x}$ ($0 < x \leq 1$)).

Example 1a

In Example 1A, $LaAlO_3$ (to be referred to as LAO hereinafter) is used for an interelectrode insulating film IN as an application example of an oxide mainly containing Al or a rare-earth except Ce. $SrTiO_3$ doped with 0.05 wt % of lanthanum (to be referred to as La-STO hereinafter) is used for a floating gate electrode FG. Al is used for a control gate electrode CG.

The flash memory cell of Example 1A has a layered structure including a semiconductor substrate 1 made of silicon, a tunnel insulating film 2 made of $SiO_2$, the floating gate electrode FG made of La-STO, the interelectrode insulating film IN made of LAO, and the control gate electrode CG made of Al.

(1) Standard Entropy of Formation

As shown in Table 1, the standard entropies of formation of the elements used for the floating gate electrode FG and interelectrode insulating film IN are −592 and −944 [KJmol−1] in Sr (SrO) and Ti ($TiO_2$) of the floating gate electrode FG (STO), respectively, and −1793.7 and −1675.7 [KJmol−1] in La ($La_2O_3$) and Al ($Al_2O_3$) of the interelectrode insulating film IN (LAO), respectively.

The standard entropies of formation converted into standard entropies of formation per unit oxygen are Sr: −592.0, Ti: −472.0, La: −1195.8, and Al: −1117.1 [KJmol−1]. When the standard entropies of formation per unit oxygen are arranged in ascending order, La<Al<Sr<Ti.

The smaller the standard entropy of formation per unit oxygen becomes, the more bonding to oxygen stabilizes. Hence, even when heat is applied in memory cell formation, and oxygen interdiffusion occurs between STO (floating gate electrode FG) and LAO (interelectrode insulating film IN), bonding of La and Al to oxygen is stable, and the insulating properties of LAO (interelectrode insulating film IN) are maintained. On the other hand, STO (floating gate electrode FG) can maintain the conductivity even when oxygen defects are formed.

(2) Relative Dielectric Constant

The relative dielectric constant is 3.9 in the tunnel insulating film 2 ($SiO_2$) and 22 in the interelectrode insulating film IN (LAO). Because of the capacitance difference based on their relative dielectric constants, the voltage applied to the tunnel insulating film 2 can be increased even when the voltage applied between the control gate electrode CG and the substrate 1 is low.

(3) Work Function and Electron Affinity

The electron affinity of the interelectrode insulating film IN (LAO) is 2.5 eV. The work function of the floating gate electrode FG (La-STO) is 4.0 eV. The difference between them is 1.5 eV. For this reason, the current flowing to the interelectrode insulating film IN in the write and erase can be suppressed sufficiently, and charges injected to the floating gate electrode FG can be held for a long time.

(4) Film Formation Method

The film formation method of each layer of the flash memory cell will be described below. The $SiO_2$ tunnel insulating film 2 was formed by loading the Si substrate 1 in a thermal oxidation furnace and heating it in an oxygen atmosphere at 950° C. for 10 minute. The floating gate electrode FG (La-STO), interelectrode insulating film IN (LAO), and control gate electrode CG (Al) were formed by sputtering. La-STO and LAO were formed in an oxygen atmosphere at a film formation temperature of 300 to 800° C. and an oxygen partial pressure of $1 \times 10^{-8}$ to $1 \times 10^{-4}$ torr. Al was formed in a vacuum at $1 \times 10^{-5}$ torr or less.

The thicknesses of the layers are as follows. The tunnel insulating film 2 ($SiO_2$) was 10 nm thick. The floating gate electrode FG (La-STO) was 10 nm thick. The interelectrode insulating film IN ($LaAlO_3$) was 22 nm thick. The control gate electrode CG (Al) was 10 nm thick.

(5) Effects

A flash memory cell having the above-described layered structure was formed and operated by setting the gate voltage of the control gate electrode CG to ±13 V. As a result, the write time was 2.1 μsec, and the erase time was 10.3 μsec. High-speed write and erase were implemented at a low voltage.

Example 1B

In Example 1B, the material of the floating gate electrode FG of Example 1A was changed to STO doped with 0.05 wt % of Nb or V (Nb-STO and V-STO), and examinations were done. The work function (4.1 eV) of Nb-STO and V-STO is almost the same as that of La-STO of Example 1A.

According to Example 1B, when Nb-STO and V-STO were used for the floating gate electrode FG, the write time was 2.0 and 2.3 μsec, and the erase time was 10.2 and 10.8 μsec, respectively. Almost the same write and erase as in La-STO of Example 1A were implemented.

Example 1C

In Example 1C, the material of the floating gate electrode FG of Example 1A was changed to strontium titanate ($SrTiO_{3-x}$) with oxygen defects, and examinations were done. STO without doping was formed by sputtering. Then, Ar ion sputtering was executed at an acceleration voltage of 20 kV for 10 minute. When oxygen defects were formed in STO by this Ar ion sputtering, the resistivity of STO could be reduced to 0.3 Ω·cm.

According to Example 1C, when the memory cell was operated, the write time was 2.5 μsec, and the erase time was 10.5 μsec. Almost the same high-speed write and erase as in Example 1A were implemented.

In Examples 1A to 1C, a material mainly containing STO is used for the floating gate electrode FG. When a dopant or oxygen defects are introduced in the floating gate electrode FG, the work function of the floating gate electrode FG is about 4.0 to 4.1 eV, i.e., almost equals the electron affinity of silicon (4.05 eV). Hence, the threshold voltage in storing/removing charges in/from the floating gate electrode FG can be stabilized. In addition, the circuit design of a conventional flash memory can be used directly.

In the examples, sputtering is used to form an STO film. However, CVD, MOCVD, ALD, or PLD may be used. To form oxygen defects in STO, the oxygen partial pressure in film formation may be reduced, or an excimer laser may be used. That is, STO need only exhibit conductivity by oxygen defects. Not only La, Nb, and V but any metal shown in Table 1 as an electrode material can be used as the dopant of STO. The floating gate electrode FG is not limited to STO. Even another conductive oxide shown in Table 1 and having a work function largely different from that of STO enables the memory operation when the voltage to be applied to the control gate electrode CG is changed.

LAO is used for the interelectrode insulating film IN. However, any other rare-earth element except Ce shown in Table 1 may be used in place of La. The interelectrode insulating film IN may be made of an oxide containing only a rare-earth element or a binary oxide containing only Al. When an oxide containing only a rare-earth element is used, Al is preferably added to the rare-earth element to suppress moisture absorption because the material readily absorbs moisture, i.e., $H_2O$. However, when, e.g., all the film formation processes are executed in one vacuum chamber without expose to moisture, a memory cell can be formed even by using a binary oxide containing only a rare-earth element.

2.2 Example 2

A flash memory cell of Example 2 is made of the above-described materials of Case 2 ($Pt/HfO_2/SrTiO_{3-x}$ ($0<x\leq1$)). More specifically, $HfO_2$ is used for an interelectrode insulating film IN as an application example of an oxide mainly containing a group 4 metal. $SrTiO_3$ doped with 0.05 wt % of lanthanum (to be referred to as La-STO hereinafter) is used for a floating gate electrode FG. Pt is used for a control gate electrode CG.

The flash memory cell of Example 2 has a layered structure including a semiconductor substrate 1 made of silicon, a tunnel insulating film 2 made of $SiO_2$, the floating gate electrode FG made of La-STO, the interelectrode insulating film IN made of $HfO_2$, and the control gate electrode CG made of Pt.

(1) Standard Entropy of Formation

As shown in Table 1, the standard entropies of formation of the elements used for the floating gate electrode FG and interelectrode insulating film IN are −592 and −944 [KJmol−1] in Sr (SrO) and Ti ($TiO_2$) of the floating gate electrode FG (STO), respectively, and −1144.7 [KJmol−1] in $HfO_2$ of the interelectrode insulating film IN ($HfO_2$).

The standard entropies of formation converted into standard entropies of formation per unit oxygen are Sr: −592.0, Ti: −472.0, and Hf: −572.4 [KJmol−1]. When the standard entropies of formation per unit oxygen are arranged in ascending order, Sr<Hf<Ti.

When heat is applied after memory cell formation, and oxygen interdiffusion occurs between STO (floating gate electrode FG) and $HfO_2$ (interelectrode insulating film IN), bonding between oxygen and Hf of STO is more stable than bonding between oxygen and Ti. Hence, the insulating properties of $HfO_2$ (interelectrode insulating film IN) are maintained. STO (floating gate electrode FG) can maintain the conductivity because oxygen defects are formed. That is, the floating gate electrode FG need only contain a material having a large standard entropy of formation per unit oxygen as a principal component.

(2) Relative Dielectric Constant

The relative dielectric constant is 3.9 in the tunnel insulating film 2 ($SiO_2$) and 22 in the interelectrode insulating film IN ($HfO_2$), as in LAO of Example 1. Because of the capacitance difference based on their relative dielectric constants, the voltage applied to the tunnel insulating film 2 can be increased.

(3) Work Function and Electron Affinity

The electron affinity of the interelectrode insulating film IN ($HfO_2$) is 2.5 eV. The work function of the floating gate electrode FG (La-STO) is 4.0 eV. The difference between them is 1.5 eV. For this reason, the current flowing to the interelectrode insulating film IN in the write and erase can be suppressed sufficiently, and charges injected to the floating gate electrode FG can be held for a long time.

(4) Film Formation Method

The film formation method of each layer of the flash memory cell will be described below. The $SiO_2$ tunnel insulating film 2 was formed by loading the Si substrate in a thermal oxidation furnace and heating it in an oxygen atmosphere at 950° C. for 10 minute. The floating gate electrode FG (La-STO), interelectrode insulating film IN ($HfO_2$), and control gate electrode CG (Pt) were formed by electron beam evaporation. La-STO and $HfO_2$ were formed in an oxygen atmosphere at a film formation temperature of 300 to 800° C. and an oxygen partial pressure of $1\times10^{-8}$ to $1\times10^{-4}$ torr. Pt was formed in a vacuum at $1\times10^{-6}$ torr or less.

The thicknesses of the layers are as follows. The tunnel insulating film 2 ($SiO_2$) was 10 nm thick. The floating gate electrode FG (La-STO) was 10 nm thick. The interelectrode insulating film IN ($HfO_2$) was 18 nm thick. The control gate electrode CG (Pt) was 30 nm thick.

(5) Effects

A flash memory cell having the above-described layered structure was formed and operated by setting the gate voltage of the control gate electrode CG to ±13 V. As a result, the write time was 2.0 μsec, and the erase time was 10.2 μsec. The same high-speed write and erase as in LAO (interelectrode insulating film IN) of Example 1 could be implemented.

2.3 Example 3

A flash memory cell of Example 3 is made of the above-described materials of Example 3 ($SrRuO_3/SrZrO_3/SrRuO_3$). More specifically, $SrZrO_3$ (to be referred to as SZO hereinafter) is used for an interelectrode insulating film IN as an application example of an oxide containing an alkaline-earth metal. $SrRuO_3$ (to be referred to as SRO hereinafter) is used for a floating gate electrode FG and control gate electrode CG.

The flash memory cell of Example 3 has a layered structure including a semiconductor substrate 1 made of silicon, a tunnel insulating film 2 made of $SiO_2$, the floating gate electrode FG made of SRO, the interelectrode insulating film IN made of SZO, and the control gate electrode CG made of SRO.

(1) Standard Entropy of Formation As shown in Table 1, the standard entropies of formation of the elements used for the floating gate electrode FG and interelectrode insulating film IN are −592 and −305 [KJmol−1] in Sr (SrO) and Ru (RuO$_2$) of the floating gate electrode FG (SRO), respectively, and −1100.6 [KJmol−1] in ZrO$_2$ of the interelectrode insulating film IN(SZO).

The standard entropies of formation converted into standard entropies of formation per unit oxygen are Sr: −592.0, Ru: −152.5, and Zr: −550.3 [KJmol−1]. When the standard entropies of formation per unit oxygen are arranged in ascending order, Sr<Zr<Ru.

Hence, SRO (floating gate electrode FG) more readily dissociates oxygen upon annealing than SZO (interelectrode insulating film IN). The insulating properties of SZO (interelectrode insulating film IN) are maintained. SRO (floating gate electrode FG) can maintain the conductivity because oxygen defects are formed.

(2) Relative Dielectric Constant

The relative dielectric constant is 3.9 in the tunnel insulating film 2 (SiO$_2$) and 60 in the interelectrode insulating film IN(SZO). Because of the capacitance difference based on their relative dielectric constants, the voltage applied to the tunnel insulating film 2 can be increased.

(3) Work Function and Electron Affinity

The electron affinity of the interelectrode insulating film IN(SZO) is 3.1 eV. The work function of the floating gate electrode FG (SRO) is 5.1 eV. The difference between them is 2.0 eV. For this reason, the current flowing to the interelectrode insulating film IN in the write and erase can be suppressed sufficiently, and charges injected to the floating gate electrode FG can be held for a long time.

(4) Film Formation Method

The film formation method of each layer of the flash memory cell will be described below. The SiO$_2$ tunnel insulating film 2 was formed by loading the Si substrate in a thermal oxidation furnace and heating it in an oxygen atmosphere at 950° C. for 10 minute. The floating gate electrode FG (SRO), interelectrode insulating film IN(SZO), and control gate electrode CG (SRO) were formed by sputtering. SZO and SRO were formed in an oxygen atmosphere at a film formation temperature of 300 to 800° C. and an oxygen partial pressure of $1 \times 10^{-8}$ to $1 \times 10^{-4}$ torr.

The thicknesses of the layers are as follows. The tunnel insulating film 2 (SiO$_2$) was 10 nm thick. The floating gate electrode FG (SRO) was 10 nm thick. The interelectrode insulating film IN (SZO) was 20 nm thick. The control gate electrode CG (SRO) was 10 nm thick.

(5) Effects

A flash memory cell having the above-described layered structure was formed and operated by setting the gate voltage of the control gate electrode CG to ±13 V. As a result, the write time was 2.6 μsec, and the erase time was 10.4 μsec. Almost the same operation as in the remaining examples could be proved.

2.4 Example 4

In Example 4, SiO$_2$ is used for a tunnel insulating film 2. La—SrTiO$_{3-x}$ ($0 \leq x \leq 1$)) doped with 0.05 wt % of lanthanum (to be referred to as La-STO hereinafter) is used for a floating gate electrode FG. LaAlO$_3$ (to be referred to as LAO hereinafter) is used for a interelectrode insulating film IN. SrRuO$_3$ (to be referred to as SRO hereinafter) is used for a control gate electrode CG.

(1) Standard Entropy of Formation

As shown in Table 1, the standard entropies of formation per unit oxygen of La and Al used for the interelectrode insulating film IN are −1195 and −1116 [KJmol−1], respectively. The standard entropies of formation per unit oxygen of Sr, Ti, and Ru used for the floating gate electrode FG and control gate electrode CG are −592, −472, and −153 [KJmol−1], respectively. The standard entropy of formation per unit oxygen is larger in the latter than the former. LAO of the interelectrode insulating film IN is more stable as an oxide than SRO of the control gate electrode CG or La-STO of the floating gate electrode FG. For this reason, oxygen defects are rarely formed, and the reliability to insulating properties can be increased.

(2) Relative Dielectric Constant

The relative dielectric constant is 3.9 in the tunnel insulating film 2 (SiO$_2$) and 22 in the interelectrode insulating film IN (LAO). Because of the capacitance difference based on their relative dielectric constants, the electric field applied to the tunnel insulating film 2 can be increased.

(3) Work Function and Electron Affinity

Figure 5:
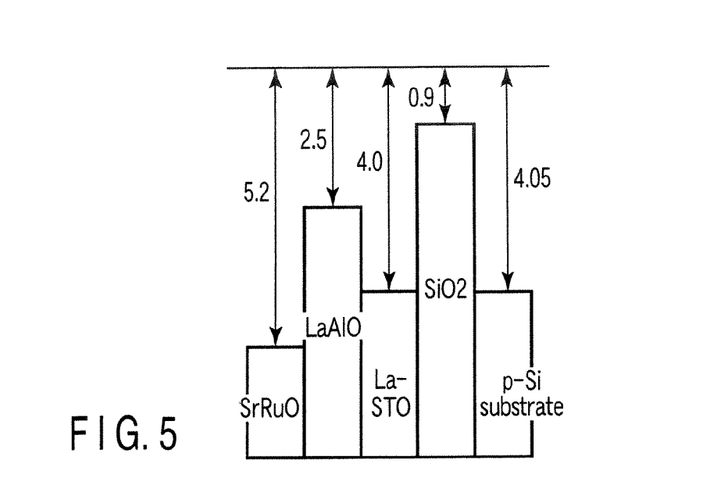
FIG. 5 is a view showing the bands of the layers of a flash memory cell according to Example 4.

FIG. 5 is a view showing the bands of the layers of the flash memory cell according to Example 4 of the present invention. A number represents the work function or electron affinity [eV]. As shown in FIG. 5, the electron affinity of the p-Si substrate 1 is 4.05 eV. The electron affinity of the tunnel insulating film 2 (SiO$_2$) is 0.9 eV. The work function of the floating gate electrode FG (La-STO) is 4.0 eV. The electron affinity of the interelectrode insulating film IN (LAO) is 2.5 eV. The work function of the control gate electrode CG (SRO) is 5.2 eV.

The work function (4.0 eV) of the floating gate electrode FG (La-STO) almost equals the work function (4.05 eV) of the n-channel polysilicon electrode doped with phosphorus. Hence, the threshold voltage in storing/removing charges in/from the floating gate electrode FG can be stabilized. In addition, the same circuit design as in a conventional flash memory cell can be used.

The electron barriers of the tunnel insulating film 2 (SiO$_2$) and interelectrode insulating film IN (LAO) with respect to the floating gate electrode FG (La-STO) are 3.1 and 1.55 [eV], respectively, i.e., much larger. For this reason, when charges are injected in the floating gate electrode FG (La-STO), the charges can be held in the floating gate electrode FG for a long time.

(4) Film Formation Method

The film formation method of each layer of the flash memory cell will be described below. The SiO$_2$ tunnel insulating film 2 was formed by heating the Si substrate 1 in an oxygen atmosphere. La-STO of floating gate electrode FG, LAO of the interelectrode insulating film IN, and SRO of the control gate electrode CG were formed by sputtering.

The thicknesses of the layers are as follows. The tunnel insulating film 2 (SiO$_2$) was 10 nm thick. The floating gate electrode FG (La-STO) was 10 nm thick. The interelectrode insulating film IN (LAO) was 22 nm thick. The control gate electrode CG (SRO) was 20 nm thick.

(5) Effects

A flash memory cell having the above-described layered structure was formed and operated to execute the write and erase by setting the gate voltage of the control gate electrode CG to ±12 V. As a result, the write time was 2.0 μsec, and the erase time was 10.6 μsec. High-speed write and erase were implemented at a low voltage.

2.5 Comparative Example

A combination of the materials of a floating gate electrode FG and interelectrode insulating film IN will be described here on the basis of the standard entropy of formation.

First, a comparative example in which a material with a larger standard entropy of formation per unit oxygen is used for the interelectrode insulating film IN than the floating gate electrode FG will be described.

In the comparative example, an $SiO_2$ film serving as a tunnel insulating film 2 was formed on an Si substrate 1 by thermal oxidation. $SrVO_3$ (SrO: −592.0 [KJmol−1], $V_2O_3$: −1218.8 [KJmol−1]) serving as the floating gate electrode FG, $TiO_2$ ($TiO_2$: −944 [KJmol−1]) serving as the interelectrode insulating film IN, and La-STO serving as a control gate electrode CG were formed by sputtering. Then, the same manufacturing steps as in Example 1 were executed.

When the write operation was executed in this comparative example, the write in the memory cell was impossible. The probable reason is that $TiO_2$ of the interelectrode insulating film IN exhibited conductivity, and the interelectrode insulating film IN and floating gate electrode FG, and the interelectrode insulating film IN and control gate electrode CG were electrically connected.

The reason why $TiO_2$ of the interelectrode insulating film IN exhibited conductivity will be described. As shown in Table 1, the standard entropy of formation per unit oxygen is −592.0 [KJmol−1] in Sr, −620.2 [KJmol−1] in V, and −472.0 [KJmol−1] in Ti. Hence, the standard entropy of formation per unit oxygen of $TiO_2$ is larger than that of $SrVO_3$. When the standard entropy of formation per unit oxygen is large, oxygen is readily dissociated. When $TiO_2$ readily dissociates oxygen, oxygen defects are readily formed in a $TiO_2$ film. When oxygen defects are formed, the resistivity of $TiO_2$ greatly decreases. For example, when $TiO_2$ changes to TiO, the conductivity of TiO decreases to $3 \times 10^{-6}$ Ω·m. If oxygen defects are formed, even an insulating material exhibits conductivity. Hence, a material that readily form oxygen defects can hardly be used for the interelectrode insulating film IN. Conversely, the floating gate electrode FG can have oxygen defects without any problem. For this reason, as the criterion of material selection of the interelectrode insulating film IN and floating gate electrode FG, a material with a larger standard entropy of formation per unit oxygen is preferably used for the floating gate electrode FG than the interelectrode insulating film IN.

Table 1 shows the standard entropies of formation of oxide materials usable for the interelectrode insulating film IN and floating gate electrode FG. As examples of the combination of the floating gate electrode FG and interelectrode insulating film IN obtained from Table 1, an oxide containing a material with a large standard entropy of formation, e.g., $TiO_2$, $IrO_2$, $ReO_2$, $RuO_2$, $SrTiO_3$, or $SrRuO_3$ is selected as the material of the floating gate electrode FG. As the material of the interelectrode insulating film IN, a rare-earth oxide such as $La_2O_3$ or $Pr_2O_3$, a compound of a rare-earth element and Al, Zr, or Hf, e.g., $LaAlO_3$, $La_2Zr_2O_7$, or $La_2Hf_2O_7$, or an oxide containing a material with a small standard entropy of formation, e.g., $Al_2O_3$, $HfO_2$, or $ZrO_2$ is selected. The magnitude of the standard entropy of formation is on the magnitude per unit oxygen. For example, $La_2O_3$ with a small standard entropy of formation per unit oxygen (−1195.8 KJmol−1) is selected for the interelectrode insulating film IN, and $RuO_2$ with a large standard entropy of formation per unit oxygen (−152.5 KJmol−1) is selected for the floating gate electrode FG. However, it is important that the materials are paraelectric materials except ferroelectric materials such as $BaTiO_3$ and $PbZrO_3$ to influence the reliability of the threshold voltage. The above-described combinations are merely examples, and the combination can be determined on the basis of the magnitude of standard entropy of formation per unit oxygen.

3. EFFECTS

According to the above-described embodiment of the present invention, the interelectrode insulating film IN is made of an insulating metal oxide of a paraelectric material having a high dielectric constant. The floating gate electrode FG is made of a conductive metal oxide. Even when a high-K oxide is used as the interelectrode insulating film IN, formation of a low-K oxide interface layer between the interelectrode insulating film IN and the floating gate electrode FG can be suppressed. A decrease in capacitance of the interelectrode insulating film IN can be suppressed. Hence, a semiconductor memory device capable of reducing the power consumption and increasing the operation speed can be provided because a high electric field can be applied to the tunnel insulating film 2, and electrons can efficiently be injected from the Si substrate 1 to the floating gate electrode FG even at a low voltage.

When a paraelectric material is used as the interelectrode insulating film IN, the threshold voltage stabilizes as compared to a ferroelectric material that readily forms oxygen defects. Hence, the reliability can be improved.

The relationship between the standard entropies $SE_{FG}$ and $SE_{IN}$ of formation per unit oxygen of the floating gate electrode FG and interelectrode insulating film IN is taken into consideration. When materials that satisfy $SE_{FG} > SE_{IN}$ are selected, the reliability of the insulating properties of the interelectrode insulating film IN can be improved. Similarly, the relationship between the standard entropies $SE_{CG}$ and $SE_{IN}$ of formation per unit oxygen of the control gate electrode CG and interelectrode insulating film IN is taken into consideration. When materials that satisfy $SE_{CG} > SE_{IN}$ are selected, the reliability of the insulating properties of the interelectrode insulating film IN can be improved.

For the cell transistor Tr of n-channel MISFET, the relationship between the work function $\phi m_{FG}$ of the floating gate electrode FG and the electron affinity $EA_{IN}$ of the interelectrode insulating film IN is taken into consideration. When materials that satisfy $\phi m_{FG} \geq EA_{IN} + 1.0$ eV are selected, the charge holding characteristic can be improved. Similarly, the relationship between the work function $\phi m_{CG}$ of the control gate electrode CG and the electron affinity $EA_{IN}$ of the interelectrode insulating film IN is taken into consideration. When materials that satisfy $\phi m_{CG} \geq EA_{IN} + 1.0$ eV are selected, the charge holding characteristic can be improved.

For the cell transistor Tr of p-channel MISFET, the relationship between the work function $\phi m_{FG}$ of the floating gate electrode FG and the electron affinity $EA_{IN}$ and band gap $EG_{IN}$ of the interelectrode insulating film IN is taken into consideration. When materials that satisfy $\phi m_{FG} \leq EG_{IN} + EA_{IN} + 1.0$ eV are selected, the charge holding characteristic can be improved. Similarly, the relationship between the work function $\phi m_{CG}$ of the control gate electrode CG and the electron affinity $EA_{IN}$ and band gap $EG_{IN}$ of the interelectrode insulating film IN is taken into consideration. When materials that satisfy $\phi m_{CG} \leq EG_{IN} + EA_{IN} + 1.0$ eV are selected, the charge holding characteristic can be improved.

In the cell transistor Tr of n-channel MISFET, a material having the work function $\phi m$ that satisfies $\phi m \leq 4.45$ eV is selected for the floating gate electrode FG and control gate electrode CG. In the cell transistor Tr of p-channel MISFET, a material having the work function $\phi m$ that satisfies $4.77$ eV $\leq \phi m$ is selected for the floating gate electrode FG and control gate electrode CG. Then, the power consumption can be reduced. In the cell transistor Tr of n-channel MISFET, a material having the work function $\phi m$ that satisfies $3.65$ eV $\leq \phi m$ is selected for the floating gate electrode FG and control gate electrode CG. In the cell transistor Tr of p-channel MISFET, a material having the work function $\phi m$ that satisfies $\phi m \leq 5.57$ eV is selected for the floating gate electrode FG and control gate electrode CG. Then, a degradation in charge holding characteristic can be suppressed.

The semiconductor substrate is not limited to the Si substrate. For example, a silicon on insulator (SOI) substrate or silicon germanium on insulator (SGOI) substrate may be used. This embodiment is applied to a flash memory of, e.g., 3× nm generation (e.g., 32 nm generation). Examples are a NAND flash memory and NOR flash memory. This embodiment can also be applied to a large-scale integration (LSI) having such a flash memory. This embodiment can be applied to a semiconductor memory device comprising at least one of a cell transistor Tr1, a select transistor Tr2 to select the cell transistor Tr1, a transistor Tr3 of a peripheral circuit to control the transistors Tr1 and Tr2, and a transistor Tr4 of a logic circuit. The same material as that of the floating gate electrode FG or control gate electrode CG can be used as the material of the gate electrode of the select transistor, the gate electrode of the peripheral circuit, or the gate electrode of the logic circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a semiconductor substrate;
a first insulating film which is formed on the semiconductor substrate;
a floating gate electrode which is formed on the first insulating film and made of a conductive metal oxide comprising $SrTiO_{3-x}$ ($0 \leq x \leq 1$);
a second insulating film which is formed on the floating gate electrode, has a relative dielectric constant of not less than 7.8, and is made of an insulating metal oxide of a paraelectric material; and
a control gate electrode which is formed on the second insulating film and made of one of a metal and a conductive metal oxide.

2. The device according to claim 1, wherein a material of the second insulating film comprises an element selected from the group consisting of alkaline-earth metals, rare-earth metals, Ti, Zr, Hf, Ta, and Al.

3. The device according to claim 1, wherein a material of the control gate electrode is the same as a material of the floating gate electrode.

4. The device according to claim 1, wherein a material of the floating gate electrode has a larger standard entropy of formation per unit oxygen than a material of the second insulating film.

5. The device according to claim 1, wherein a material of the control gate electrode has a larger standard entropy of formation per unit oxygen than a material of the second insulating film.

6. The device according to claim 1, wherein
a material of the second insulating film is $LaAlO_3$, and
a material of the control gate electrode is Al.

7. The device according to claim 1, wherein
a material of the second insulating film is $HfO_2$, and
a material of the control gate electrode is Pt.

8. The device according to claim 1, wherein
a material of the second insulating film is $SrZrO_3$, and
a material of the control gate electrode is $SrRuO_3$.

9. The device according to claim 1, wherein
a material of the second insulating film is $LaAlO_3$, and
a material of the control gate electrode is $SrRuO_3$.

10. The device according to claim 1, wherein
a material of the second insulating film is selected from the group consisting of an oxide of La and Al, an oxide of Hf, an oxide of Sr and Zr, an oxide of La and Zr, an oxide of La and Hf, and an oxide of Zr, and
a material of the floating gate electrode is selected from the group consisting of an oxide of Sr and Ti doped with La, an oxide of Sr and Ti doped with Nb, an oxide of Sr and Ti doped with V, an oxide of Sr and Ru, and an oxide of Ti.

11. The device according to claim 1, wherein
a crystal structure of the control gate electrode is the same as a crystal structure of the floating gate electrode.

12. The device according to claim 1, wherein a material of the floating gate electrode is selected from the group consisting of $SrTiO_{3-x}$ ($0<x\leq1$) doped with La, $SrTiO_{3-x}$ ($0<x\leq1$) doped with Nb, and $SrTiO_{3-x}$ ($0<x\leq1$) doped with V.

13. The device according to claim 1, wherein the first insulating film comprises an $SiO_2$ or SiON insulating film.

14. The device according to claim 1, wherein a work function of the floating gate electrode is larger than an electron affinity of the material of the interelectrode insulating film by 1.0 eV or more.

* * * * *